(12) United States Patent
Kakoschke et al.

(10) Patent No.: US 7,978,504 B2
(45) Date of Patent: Jul. 12, 2011

(54) FLOATING GATE DEVICE WITH GRAPHITE FLOATING GATE

(75) Inventors: Ronald Kakoschke, Munich (DE); Harald Seidl, Poering (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/131,938

(22) Filed: Jun. 3, 2008

(65) Prior Publication Data

US 2009/0294832 A1 Dec. 3, 2009

(51) Int. Cl.
*G11C 11/00* (2006.01)

(52) U.S. Cl. ............. 365/156; 365/185.01; 365/185.02; 365/185.26

(58) Field of Classification Search .................. 365/156, 365/185.01, 185.02, 185.26
See application file for complete search history.

(56) References Cited

U.S. PATENT DOCUMENTS

| | | | |
|---|---|---|---|
| 6,245,417 B1 * | 6/2001 | Huang | 428/216 |
| 6,692,327 B1 * | 2/2004 | Deguchi et al. | 445/49 |
| 6,841,448 B2 | 1/2005 | Gehring et al. | |
| 6,933,531 B1 * | 8/2005 | Ishikawa et al. | 257/76 |
| 7,285,429 B2 * | 10/2007 | Shigaki et al. | 438/15 |
| 7,538,378 B2 * | 5/2009 | Jung | 257/316 |
| 2005/0056877 A1 | 3/2005 | Rueckes et al. | |
| 2006/0220094 A1 | 10/2006 | Lojek | |
| 2007/0014151 A1 | 1/2007 | Zhang et al. | |
| 2008/0277719 A1 * | 11/2008 | Choi et al. | 257/324 |
| 2009/0184389 A1 * | 7/2009 | Bertin et al. | 257/476 |

FOREIGN PATENT DOCUMENTS

| | | |
|---|---|---|
| DE | 102004023301 A1 | 12/2005 |
| DE | 102004049452 A1 | 4/2006 |
| WO | 2005033358 A2 | 4/2005 |
| WO | 2006/000175 A1 | 1/2006 |

OTHER PUBLICATIONS

Chen She, Jing Pu, Ming Fu Li, Byung Jin Cho; Improvement of Retention and Vth Window in Flash Memory Device through Optimization of Floating Gate Doping; ICMTD-2007; pp. 99-101.

Yanjun Ma, Rui Deng, Bin Wang, Andy Horch, Ron Paulsen; Data Retention Reliability of P+ Poly Floating Gate Memories in Logic CMOS Processes;ICMTD-2007; pp. 117-120.

G. Aichmayr, A. Avellan, G.S. Duesberg, F. Kreupl, S. Kudelka, M. Liebau, A. Orth, A. Saenger, J. Schumann, O. Storbeck; Carbon / high-k Trench Capacitor for the 40nm DRAM Generation; 2007 Symposium on VLSI Technology Digest of Technical Papers; pp. 186-187.

Robert Seidel, Georg S. Guesberg, Eugen Unger, Andrew P. Graham, Maik Liebau, Franz Kreupl; Chemical Vapor Deposition Growth of Single-Walled Carbon Nanotubes at 600 ° C and a Simple Growth Model; J. Phys. Chem B; American Chemical Society; 10.1021/jp037063z; pp, received: Oct. 10, 2003, Final form:Dec. 3, 2003.

Seong-Wan Ryu, Xing-Jiu Huang, and Yang-Kyu Choi Vertically standing carbon nanotubes as charge storage nodes for ultimately scaled nonvolatile memory application Applied Physics Letters, Aug. 7, 2007, vol. 91, 063110, 3 pages.

* cited by examiner

*Primary Examiner* — Connie C Yoha
(74) *Attorney, Agent, or Firm* — Infineon Technologies; Philip H. Schlazer

(57) ABSTRACT

One or more embodiments relate to a memory device, comprising: a substrate; a charge storage layer disposed over the substrate; and a control gate disposed over the charge storage layer, wherein the charge storage layer or the control gate layer comprises a carbon allotrope.

10 Claims, 4 Drawing Sheets

FLOATING GATE DEVICE WITH GRAPHITE FLOATING GATE

FIELD OF THE INVENTION

Generally, the present invention relates to semiconductor devices and methods of making semiconductor devices. More particularly, the present invention relates to the application of allotropes of carbon to semiconductor technology.

BACKGROUND OF THE INVENTION

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0". One type of memory device is a charge storage memory device. An example of a charge storage memory device is a floating gate device. Another example of a charge storage memory device is a charge trapping device.

SUMMARY OF THE INVENTION

An embodiment of the invention is a memory device, comprising: a substrate; a charge storage layer disposed over the substrate; and a control gate disposed over the charge storage layer, wherein the charge storage layer or the control gate layer comprises a carbon allotrope.

An embodiment of the invention is a memory device, comprising: a substrate; and a gate stack disposed over the substrate, the stack comprising a control gate disposed over a charge storage layer, the control gate or the charge storage layer comprising a carbon allotrope.

An embodiment of the invention is a memory device, comprising: a substrate; a gate stack disposed over the substrate, the gate stack comprising a control gate disposed over a charge storage layer; and a spacer select gate disposed over the substrate and laterally disposed from gate stack, the select gate comprising a carbon allotrope.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In this document, the terms "a" or "an" are used, as is common in patent documents, to include one or more than one. In this document, the term "or" in used to refer to "non-exclusive or", such that "A or B" includes "A but not B", "B but not A", and "A and B", unless otherwise indicated.

Figure 1:
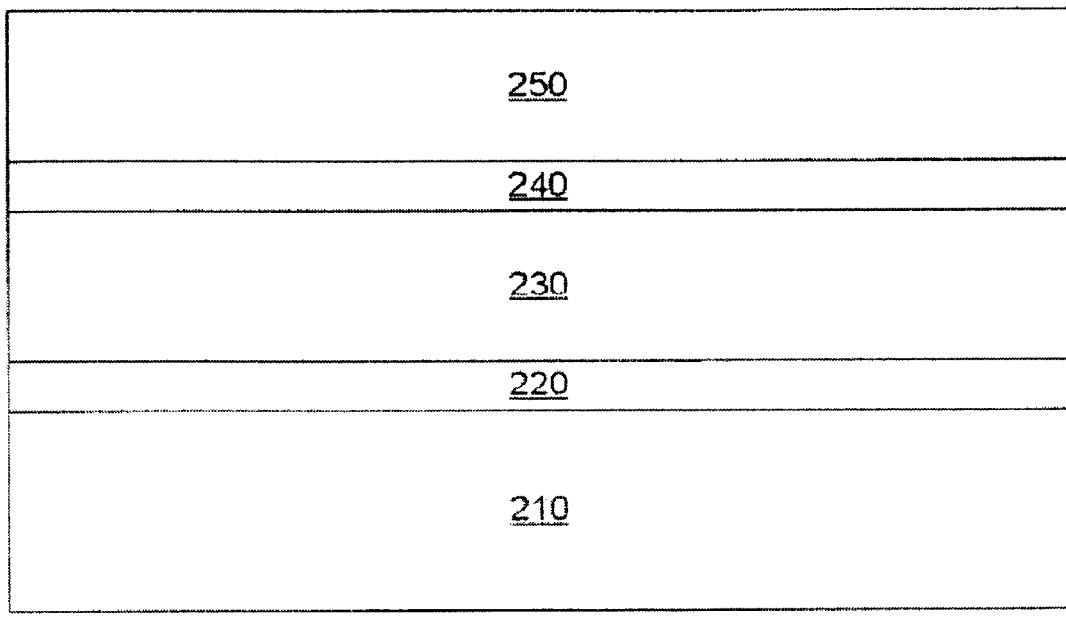
FIG. 1, show embodiments for making a semiconductor device in accordance with present invention.

Referring to FIG. 1, a semiconductor substrate 210 is provided. The substrate 210 may be any type of substrate. In an embodiment, the substrate 210 may be a p-type substrate. However, more generally, in one or more embodiments of the invention, the substrate may be a silicon substrate or other suitable substrate. The substrate may be a bulk mono-crystalline silicon substrate (or a layer grown thereon or otherwise formed therein), a layer of (110) silicon on a (100) silicon wafer, a silicon-on-insulator (SOI) substrate. The SOI substrate may, for example, be formed by a SIMOX process. The substrate may be a silicon-on-sapphire (SOS) substrate. The substrate may be a germanium-on-insulator (GeOI) substrate. The substrate may include one or more materials such as semiconductor materials such as silicon germanium, germanium, germanium arsenide, indium arsenide, indium arsenide, indium gallium arsenide, or indium antimonide.

Next, a first dielectric layer 220 is formed over the substrate 210. In one or more embodiments, the first dielectric layer 220 may comprise an oxide (such as silicon dioxide $SiO_2$), a nitride (such as silicon nitride, $Si_3N_4$ or $Si_xN_y$), an oxynitride (such as silicon oxynitride, S—O—N or $SiO_xN_y$), an oxide/nitride stack such as a $SiO_2/Si_xN_y$ stack (where the layers may be in any order), an oxide/nitride/oxide stack (for example, an ONO stack) or combinations thereof.

In one or more embodiments, the first dielectric layer 220 may comprise a high-k dielectric material. The high-k material may have a dielectric constant greater than 3.9. The high-k material may have a dielectric constant greater than silicon dioxide. The high-k material may comprise a hafnium-based material. The high-k material may comprise one or more of the elements Hf, Al, Si, Zr, O, N, Ta, La, Ti, Y, Pr, Gd and combinations thereof. The high-k material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-k material may comprise $Al_2O_3$. In one or more embodiments, the first dielectric layer 220 may comprise any other dielectric material or high-k dielectric material. In one or more embodiments, the first dielectric layer 220 may comprise an oxide/high-k stack such as a $SiO_2/Al_2O_3$ stack.

In one or more embodiments, the first dielectric layer may have a thickness of at least 4 nm (nanometers). In one or more embodiments, the first dielectric layer 220 may have a thickness of at least 6 nm. In one or more embodiments, the first dielectric layer may have a thickness of at least 8 nm. In one or more embodiments, the first dielectric layer may have a thickness of less than about 15 nm. In one or more embodiments, the first dielectric layer may have a thickness of less than about 12 nm. In one or more embodiments, the first dielectric layer may comprise a single layer of material or it may comprise two or more layers of material.

The first dielectric layer 220 may be formed in many different ways. For example, the first dielectric layer 220 may be grown by a thermal oxidation, deposited by a chemical vapor deposition (CVD), atomic layer deposition (ALD), physical vapor deposition (PVD), or a jet vapor deposition. Hence, the first dielectric layer may be formed by a growth process or by a deposition process.

A high-k material may be formed, for example, by a deposition process. Examples of deposition process which may be used include chemical vapor deposition (CVD), physical vapor deposition (PVD), atomic layer deposition (ALD), molecular beam epitaxy (MDE), or other deposition processes.

In one or more embodiments, the first dielectric layer 220 may serve as a tunneling dielectric layer for a floating gate memory device. In another embodiment of the invention, the first dielectric layer 220 may serve as a first dielectric layer for a charge trapping memory device.

In a subsequent processing step, a charge storage layer 230 may be formed over the first dielectric layer 220. In one or more embodiments, the charge storage layer 230 may be formed of any conductive material. Hence, in one or more embodiments, the charge storage layer may comprise any conductive material. In one or more embodiments, the charge storage layer may comprise, for example, a polysilicon material. The polysilicon may be doped with an n-type dopant (such as phosphorus) or a p-type dopant (such as boron). The doping may be accomplished using an ion implantation process or it may be done in-situ.

In one or more embodiments, the charge storage layer 230 may comprise a metallic material such as a pure metal or a metal alloy. In one or more embodiments, the charge storage layer 230 may comprise a conductive material. In one or more embodiments, the charge storage layer may comprise a semiconductor material. In one or more embodiments, it is possible that the charge storage layer 230 may comprise a dielectric material. In one or more embodiments, the charge storage layer 230 may comprise a metal silicide or a metal nitride.

In one or more embodiments, the charge storage layer 230 may comprise TiN, TiC, HfN, TaN, TaC, TaN, W, Al, Ru, RuTa, TaSiN, NiSix, CoSix, TiSi$_x$, Ir, Y, Pt, I, Pt, Ti, Pd, Re, Rh, borides of Ti, borides of Hf, borides of Zr, phosphides of Ti, phosphide of Hf, phoshides of Zr, antimonides of Ti, antimonides of Hf, antimonides of Zr, TiAlN, Mo, MoN, ZrSiN, ZrN, HfN, HfSiN, WN, Ni, Pr, VN, TiW, and/or combinations thereof.

In one or more embodiments, the charge storage layer 230 may comprise the element carbon. In one or more embodiments, the charge storage layer 230 may comprise a carbon compound. In one or more embodiments, the charge storage layer may comprise molecular carbon. In one or more embodiments, the charge storage layer 230 may comprise an allotrope of carbon. An allotrope of carbon may also be referred to as a carbon allotrope. Examples of carbon allotropes include, but are not limited to, diamond, graphite, amorphous carbon, and fullerenes (e.g. buckminsterfullerenes). Examples of fullerenes include, but are not limited to, buckyballs, carbon nanotubes and nanobuds. Further examples of carbon allotropes include, but are not limited to, aggregated diamond nanorods (or ADNRs), glassy carbon, carbon nanoform, lonsdaleite and linear acetylenic carbon (or LAC). In one or more embodiments, the charge storage layer 230 may comprise a conductive allotrope of carbon (also referred to as a conductive carbon allotrope). In one or more embodiments, the charge storage layer 230 may comprise graphite.

When the charge storage layer 230 comprises an allotrope of carbon, it is possible that the carbon may be deposited by a carbon chemical vapor deposition process. As an example, this may be a $C_xH_y$ based CVD process).

When the charge storage layer 230 comprises an allotrope of carbon, in an optional step, it may be useful to perform a carbon passivation step to seal the carbon allotrope in the charge storage 230. The carbon passivation may be done by the use of a SiH$_4$ soak process which would form a SiC layer over the charge storage layer 230. This may be done either before or after the gate stack is patterned (where patterning of the gate stack is discussed below).

In one or more embodiments, the charge storage layer 230 may comprise a nitride. In one or more embodiments, the charge storage layer 230 may comprise a nanocrystalline material. In one or more embodiments, the charge storage layer 230 may comprises a high-k dielectric material.

The charge storage layer 230 may comprise a single layer or a plurality of stacked layers (such as a polysilicon layer disposed over a metal layer). In one or more embodiments, the thickness of the charge storage layer 230 may be about 30 nm to about 300 nm, however, other thicknesses are also possible. The charge storage layer 230 may be deposited in many different ways. Examples include chemical vapor deposition, physical vapor deposition and atomic layer deposition. In one or more embodiments, the charge storage layer 230 may be a mixture (such as a heterogeneous mixture) of two or more different materials.

In one or more embodiments, the charge storage layer 230 may serve as floating gate layer of a floating gate device. In one or more embodiments, the charge storage layer 230 may serve as a charge trapping layer for a charge trapping device. In one or more embodiments, it is possible that any of the materials described above for the charge storage layer may be useful for either a floating gate layer for a floating gate device or as a charge trapping layer for a charge trapping device.

In one or more embodiments, the charge storage layer 230 may serve as a floating gate layer of a floating gate memory device. Hence, the charge storage layer 230 may include any material that can serve as a floating gate for a floating gate memory device.

In one or more embodiments, the material for a floating gate layer may be formed of any conductive material. Hence, in one or more embodiments, the floating gate material may comprise any conductive material. In one or more embodiments, the floating gate material may comprise, for example, a polysilicon material. The polysilicon may be doped with an n-type dopant (such as phosphorus) or a p-type dopant (such as boron). The doping may be accomplished using an ion implantation process or it may be done in-situ.

In one or more embodiments, the floating gate material may comprise a metallic material such as a pure metal or a metal alloy. In one or more embodiments, the floating gate material may comprise a conductive material. In one or more embodiments, the floating gate material may comprise a semiconductor material. In one or more embodiments, it is possible that the floating gate material may comprise a dielectric material. In one or more embodiments, the floating gate material may comprise a metal silicide or a metal nitride.

In one or more embodiments, the floating gate material may comprise TiN, TiC, HfN, TaN, TaC, TaN, W, Al, Ru, RuTa, TaSiN, NiSix, CoSix, TiSi$_x$, Ir, Y, Pt, I, Pt, Ti, Pd, Re, Rh, borides of Ti, borides of Hf, borides of Zr, phosphides of Ti, phosphide of Hf, phoshides of Zr, antimonides of Ti, antimonides of Hf, antimonides of Zr, TiAlN, Mo, MoN, ZrSiN, ZrN, HfN, HfSiN, WN, Ni, Pr, VN, TiW, and/or combinations thereof.

In one or more embodiments, the floating gate material may comprise the element carbon. In one or more embodiments, the floating gate material may comprise a carbon compound. In one or more embodiment, the floating gate material may comprise molecular carbon. In one or more embodiments, the floating gate material may comprise an allotrope of carbon (which may also be referred to as a carbon allotrope). Examples of carbon allotropes include, but are not limited to, diamond, graphite, amorphous carbon, and fullerenes (e.g. buckminsterfullerenes). Examples of fullerenes include, but are not limited to, buckyballs, carbon nanotubes and nanobuds. Further examples of carbon allotropes include, but are not limited to, aggregated diamond nanorods (or ADNRs), glassy carbon, carbon nanoform, lonsdaleite and linear acetylenic carbon (or LAC). In one or more embodiments, the floating gate material may comprise a conductive allotrope of carbon (also referred to as a conductive carbon allotrope). In one or more embodiments, the floating gate material may comprise graphite.

When the floating gate material comprises an allotrope of carbon, it is possible that the carbon may be deposited by a carbon chemical vapor deposition process. As an example, this may be a $C_xH_y$ based CVD process).

When the floating gate material comprises an allotrope of carbon, in an optional step, it may be useful to perform a carbon passivation step to seal the carbon allotrope in the floating gate material. The carbon passivation may be done by the use of a $SiH_4$ soak process which would form a SiC layer over the floating gate material. This may be done either before or after the gate stack is patterned (where patterning of the gate stack is discussed below).

In one or more embodiments, the charge storage layer 230 may serve as a charge trapping layer for a charge trapping memory device. Hence, the charge storage layer may include any material that can serve as a charge trapping layer for a charge trapping memory device. Examples of charge trapping materials include, without limitation, nitrides (such as silicon nitride), nanocrystalline materials and, possibly, certain high-k materials. In one or more embodiments, the charge trapping layer may comprise a dielectric material.

Referring again to FIG. 1, after the formation of the charge storage layer 230, a second dielectric layer 240 may be formed over the charge storage layer 230. In one or more embodiments, the second dielectric layer 240 may be formed by a deposition process. In one or more embodiments, the second dielectric layer 240 may be formed by a growth process. In one or more embodiments, the second dielectric layer 240 may comprise an oxide (such as silicon dioxide $SiO_2$), a nitride (such as $Si_3N_4$ or $Si_xN_y$) an oxynitride (such as silicon oxynitride, S—O—N or $SiO_xN_y$), or combinations thereof. In one or more embodiments, the second dielectric layer 240 may comprise a stack of two or more layers (or a stack of three or more layers) such as an oxide/nitride stack such as a $SiO_2/Si_3N_4$ or an $SiO_2/Si_xN_y$ stack or a nitride/oxide stack, an oxide/nitride/oxide stack (for example, an ONO stack) or combinations thereof.

In one or more embodiments, the second dielectric layer 240 may comprise a high-k dielectric material. The high-k material may have a dielectric constant greater than 3.9. The high-k material may have a dielectric constant greater than silicon dioxide. The high-k material may comprise a hafnium-based material. The high-k material may comprise one or more of the elements Hf, Al, Si, Zr, O, N, Ta, La, Ti, Y, Pr, Gd and combinations thereof. The high-k material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-k material may comprise $Al_2O_3$. Alternatively, the second dielectric layer 240 may comprise any other dielectric material or high-k dielectric material.

In one or more embodiments, the second dielectric layer 240 may have a thickness of at least 4 nm (nanometers). In one or more embodiments, the second dielectric layer may have a thickness of at least 6 nm. In one or more embodiments, the second dielectric layer may have a thickness of at least 8 nm. In one or more embodiments, the second dielectric layer 240 may have a thickness of less than about 20 nm. In one or more embodiments, the second dielectric layer 240 may have a thickness of less than about 15 nm. Other thicknesses are also possible. In one or more embodiments, the second dielectric layer 240 may comprise a single layer of material or it may comprise two or more layers of material.

The second dielectric layer 240 may be formed in many different ways. In one or more embodiments, the second dielectric layer 240 may be formed by deposition process. In one or more embodiments, the second dielectric layer 240 may be formed by a growth process (such as a thermal growth process). For example, the second dielectric layer may be grown by a thermal oxidation, deposited by a chemical vapor deposition (CVD), atomic layer deposition (ALD), physical vapor deposition (PVD), or a jet vapor deposition. Hence, the second dielectric layer may, for example, be formed by a growth process or by a deposition process.

As noted above, a high-k material may be formed, for example, by a deposition process. Examples of deposition process which may be used include chemical vapor deposition (CVD), physical vapor deposition (PVD), atomic layer deposition (ALD), molecular beam epitaxy (MDE), or other deposition processes.

In one or more embodiments, the second dielectric layer 240 may serve as an inter-gate dielectric layer between a floating gate and a control gate of a floating gate memory device. In one or more embodiments, the floating gate and the control gate may both be formed of a polysilicon material. In this case, the second dielectric layer 240 may serve as inter-poly dielectric material.

It is noted that the use of a high-k material as an inter-gate dielectric layer (or as an interpoly dielectric layer) in a floating gate memory device may be beneficial since the larger dielectric constant may lead to larger capacitive coupling. This may lead to a reduction in the power needed to operate the device.

Next, a control gate layer 250 may be formed over the second dielectric layer. The control gate layer 250 may be an upper gate layer. In one or more embodiments, the control gate layer 250 may be formed of any conductive material. Hence, in one or more embodiments, the control gate layer 250 may comprise any conductive material.

In one or more embodiments, the control gate layer 250 may comprise, for example, a polysilicon material. The polysilicon may be doped with an n-type dopant (such as phosphorus) or a p-type dopant (such as boron). The doping may be accomplished using an ion implantation process or be done in-situ. In one or more embodiments, doping may be at least partially accomplished after the formation of the gate stack as explained below. In one or more embodiments, doping of the control gate layer 250 may be at least partially accomplished during the formation of the source/drain extensions and/or the source/drain regions.

In one or more embodiments, the control gate layer 250 may comprise a metallic material such as a pure metal or a metal alloy. In one or more embodiments, the control gate layer may be any other material suitable as a control gate for a charge storage memory device. In one or more embodiments, the control gate layer 250 may comprise a metal silicide or a metal nitride. In one or more embodiments, the control gate layer 270 may comprise TiN, TiC, HfN, TaN, TaC, TaN, W, Al, Ru, RuTa, TaSiN, NiSix, CoSix, $TiSi_x$, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof.

In one or more embodiments, the control gate layer 250 may comprise the element carbon. In one or more embodiments, the control gate layer 250 may comprise a carbon compound. In one or more embodiments, the control gate layer 250 may comprise molecular carbon. In one or more embodiments, the control gate layer 250 may comprise an allotrope of carbon (which may also be referred to as a carbon allotrope). Examples of carbon allotropes include, but are not limited to, diamond, graphite, amorphous carbon, and fullerenes (e.g. buckminsterfullerenes). Examples of fullerenes include, but are not limited to, buckyballs, carbon nanotubes and nanobuds. Further examples of carbon allotropes include, but are not limited to, aggregated diamond nanorods (or ADNRs), glassy carbon, carbon nanoform, lonsdaleite and linear acetylenic carbon (or LAC). In one or more embodiments, the control gate layer 250 may comprise a conductive allotrope of carbon (also referred to as a conductive carbon allotrope). In one or more embodiments, the control gate layer 250 may comprise graphite.

The control gate layer 250 may comprise a single layer or a plurality of stacked layers (such as a polysilicon layer disposed over a metal layer). The control gate layer 250 may comprise a mixture (such as a heterogeneous mixture) of two or more different materials. In one or more embodiments, the thickness of the control gate layer 250 may be about 30 nanometer to about 300 nanometer, however, other thicknesses are also possible. The control gate layer 250 may be deposited in many different ways. Examples, include chemical vapor deposition, physical vapor deposition and atomic layer deposition.

When the control gate layer 250 comprises an allotrope of carbon, it is possible that the carbon may be deposited by a carbon chemical vapor deposition process. As an example, this may be a $C_xH_y$ based CVD process).

When the control gate layer 250 comprises an allotrope of carbon, in an optional step, it may be useful to perform a carbon passivation step to seal the carbon allotrope in the control gate layer 250. The carbon passivation may be done by the use of a $SiH_4$ soak process which would form a SiC layer over the control gate layer 250. This may be done either before or after the gate stack is patterned (where patterning is discussed below.)

In one or more embodiments, the control gate layer 250 may serve as a control gate for a floating gate memory device. In one or more embodiments, the control gate layer may serve as a control gate for a charge trapping memory device.

Figure 2A:
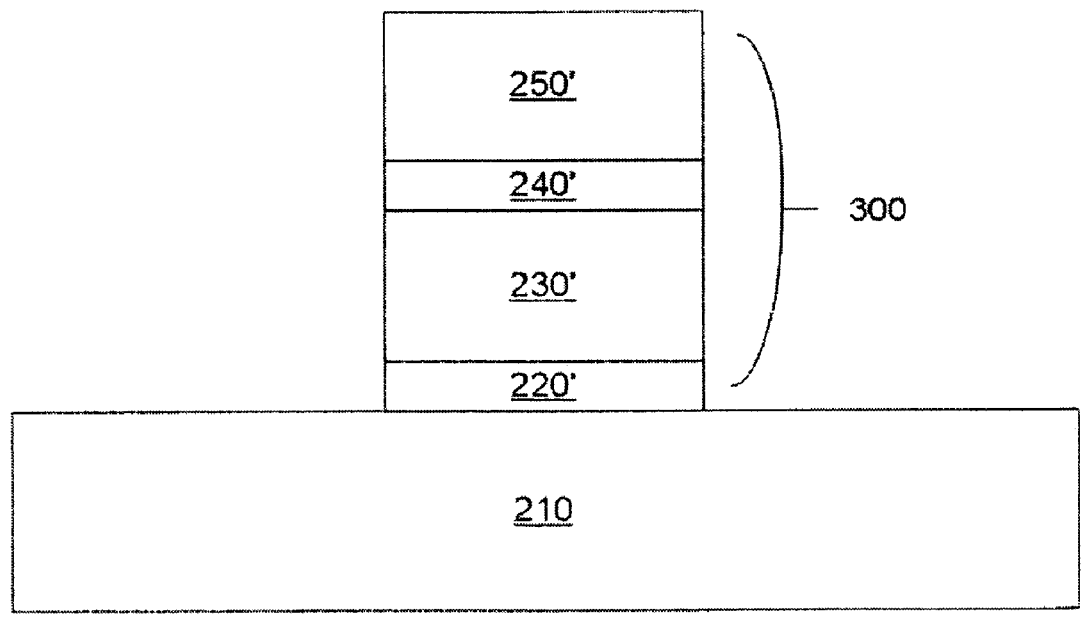
FIGS. 2A-C show embodiments for making a semiconductor device in accordance with present invention.

In a subsequent processing step, the layers 220, 230, 240 and 250 may be masked and etch to form the gate stack 300 shown in FIG. 2A. The gate stack 300 comprises a first dielectric layer 220' which is a portion of the first dielectric layer 220 from FIG. 1. The first dielectric layer 220' may also be referred to as a first gate dielectric.

The gate stack 300 further comprises a charge storage layer 230' which is a portion of the charge storage layer 230 from FIG. 1. In one or more embodiments, the charge storage layer 230' may be a floating gate layer 230' for a floating gate memory device. A floating gate layer 230' may also be referred to as a floating gate. In one or more embodiments, the charge storage layer 230' may be a charge trapping layer 230' for a charge trapping memory device.

The gate stack 300 further comprises a second dielectric layer 240' which is a portion of second dielectric layer 240 from FIG. 1. The gate stack 300 further comprises a control gate layer 250' which is a portion of control gate layer 250 from FIG. 1. The control gate layer 250' may also be referred to as a control gate for the charge storage memory device.

It is noted that the etch process to form the gate stack 300 may take one or two or more etching steps. In one or more embodiments, at least one etch chemistry may be involved. In one or more embodiments, at least two etch chemistries may be involved.

Figure 2B:
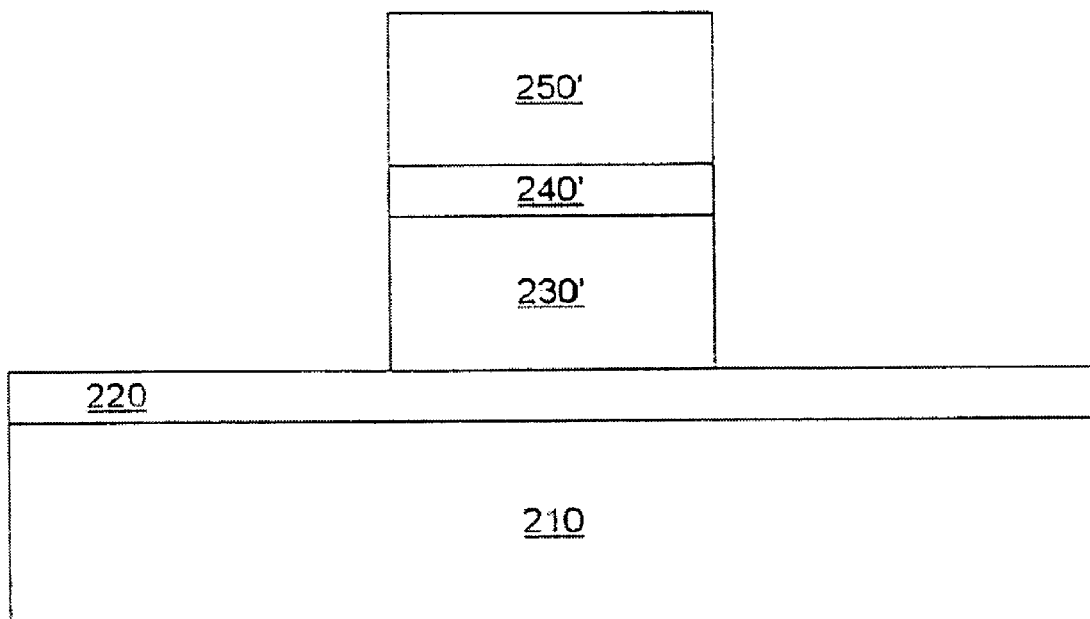
Figure 2C:
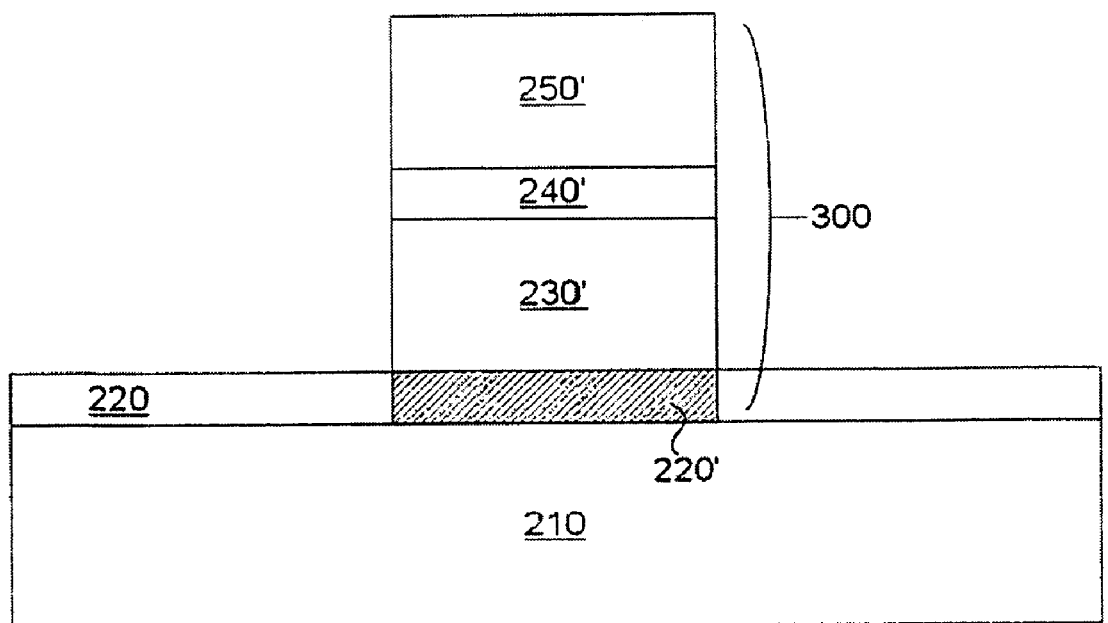

Referring to FIG. 2B, in one or more embodiments, the etch process to form the gate stack may stop on (or within) the first dielectric layer 220. Referring to FIG. 2C, in this embodiment, the gate stack 300 may comprise at least a portion 220' of the first dielectric layer 220 which underlies the control gate layer 250'. Hence, as an example, the gate stack 300 may comprise the hatched portion 220' of first dielectric layer 220 as shown in FIG. 2C.

Referring to the structure shown in FIG. 2A or to the structure shown in FIG. 2C, in one or more embodiments, it is possible that the charge storage layer 230' and/or the control gate layer 250' comprise a carbon allotrope. After forming gate stack 300 it is possible to passivate the carbon material using a carbon passivation step. The carbon passivation step may include passivation with an $SiH_4$ soak. This may lead to the formation of an SiC layer on at least a portion of the surface of the carbon gate layers. In addition, when either the charge storage layer 230 and/or the control gate layer 250 from FIG. 1 comprises a carbon allotrope it is possible that the processes used to form the gate stack 300 shown in either FIG. 2A or in FIG. 2C include a carbon etch with $O_2$ or $H_2$ based reactive ion etch.

Referring to the structure shown in FIG. 2A or to the structure shown in FIG. 2C, in one or more embodiments, it is possible that the charge storage layer 230' of gate stack 300 comprises a carbon allotrope but the control gate layer 250' does not. In one or more embodiments, it is possible that the control gate layer 250' comprises a carbon allotrope but the charge storage layer 230' does not. In one or more embodiments, it is possible that the charge storage layer 230' comprises a carbon allotrope and the control gate layer 250' also comprises a carbon allotrope. The carbon allotrope used for the charge storage layer 230' need not be the same as the carbon allotrope used for the control gate layer 250'. As noted, the carbon allotrope may be a conductive carbon allotrope. In one or more embodiments, the carbon allotrope used may comprise graphite. In one or more embodiments, the charge storage layer may be a floating gate layer. In one or more embodiments, the charge storage layer may be a charge trapping layer.

In one or more embodiments, at least one of the carbon allotropes may show no or very little charge depletion layer. In the case that a carbon allotrope charge storage layer is used as a floating gate for a floating gate memory device, this may result in an enhanced erase performance because the control gate to floating gate capacitance may be increased compared to when the floating gate comprises a doped polysilicon. In the case of a carbon allotrope control gate, this may result in an enhanced program performance because the effective tunnel oxide thickness may be reduced.

In one or more embodiments, carbon allotropes may be used as materials for the control gate and/or for the charge storage layer of the gate stack. The charge storage layer may serve as a floating gate layer (e.g. a floating gate) for a floating gate memory device or it may serve as a charge storage layer.

In one or more embodiments, a carbon allotrope may have a midgap workfunction of about 4.6V. This may increase the tunneling barrier and consequently data retention. In one or more embodiments, a carbon allotrope may have an excellent thermal stability (such as for temperatures greater than about 1500° C.). In one or more embodiments, a carbon allotrope may have a low chemical reactivity. In one or more embodiments, a carbon allotrope may have an electrical resistivity of about 50E-6 ohm-meters or below. In one or more embodiments, a carbon allotrope may have an electrical resistivity of about 10E-6 ohm-meters or below. In one or more embodiments, a carbon allotrope may not require impurity doping and therefore may have a low surface roughness and a relatively smooth interface to dielectrics.

Figure 3:
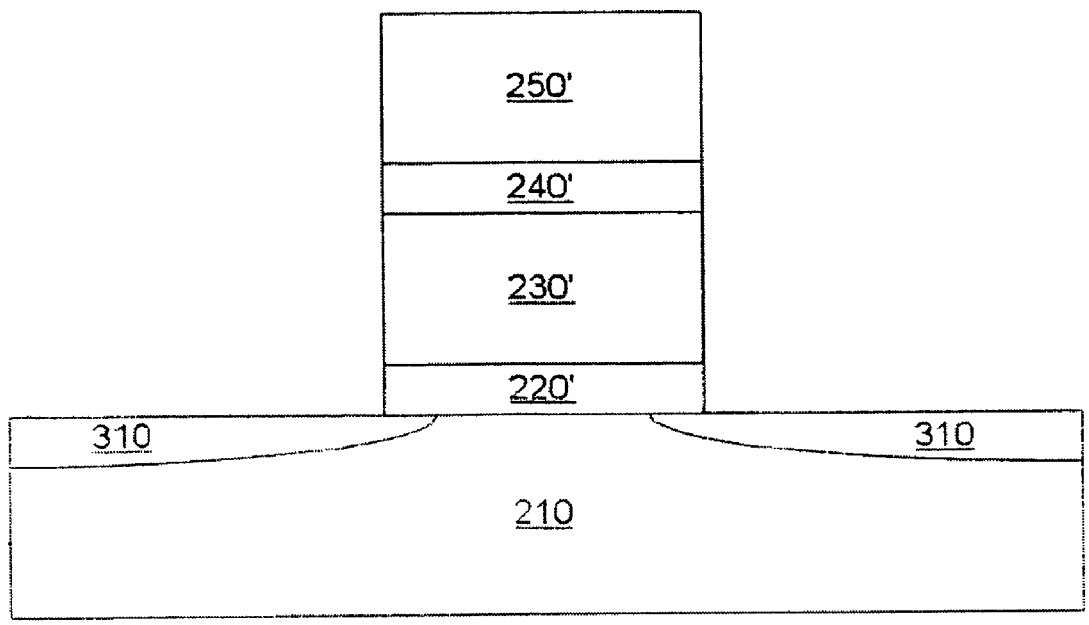
FIG. 3 show embodiments for making a semiconductor device in accordance with present invention.

In a subsequent processing step, the structure shown in FIG. 2A may be subject to an ion implantation process to form source/drain extension regions 310 as shown in FIG. 3. (Of course, in another embodiment, the structure shown in FIG. 2C may be used). Referring to FIG. 3, in one or more embodiments, the source/drain extension regions 310 may, for example, be lightly doped drain (LDD) regions. In one or more embodiments, the extension regions 310 may, for example, medium doped drain (MDD) regions.

In one or more embodiments, the extension regions 310 may be n-type. In one or more embodiments, the extension regions 310 may be p-type.

Figure 4:
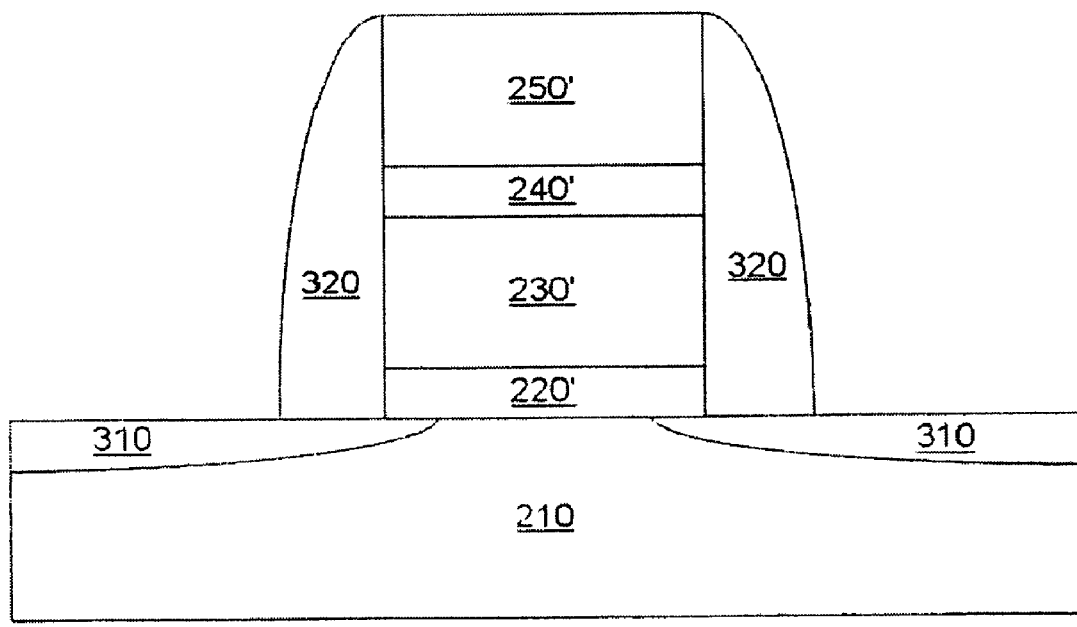
FIG. 4 show embodiments for making a semiconductor device in accordance with present invention.

Referring to FIG. 4, after the formation of the extension regions 310 regions, sidewall spacers 320 may be formed over the sidewalls of the gate stack 300. In one or more embodiments, the sidewall spacers 320 may be formed of any dielectric material. Examples of dielectric materials include, but not limited to, oxides, nitrides, oxynitrides and mixtures thereof. The sidewall spacers 320 may, for example, be formed by the conformal deposition of a dielectric material followed by the anisotropic etch of the material.

Figure 5:
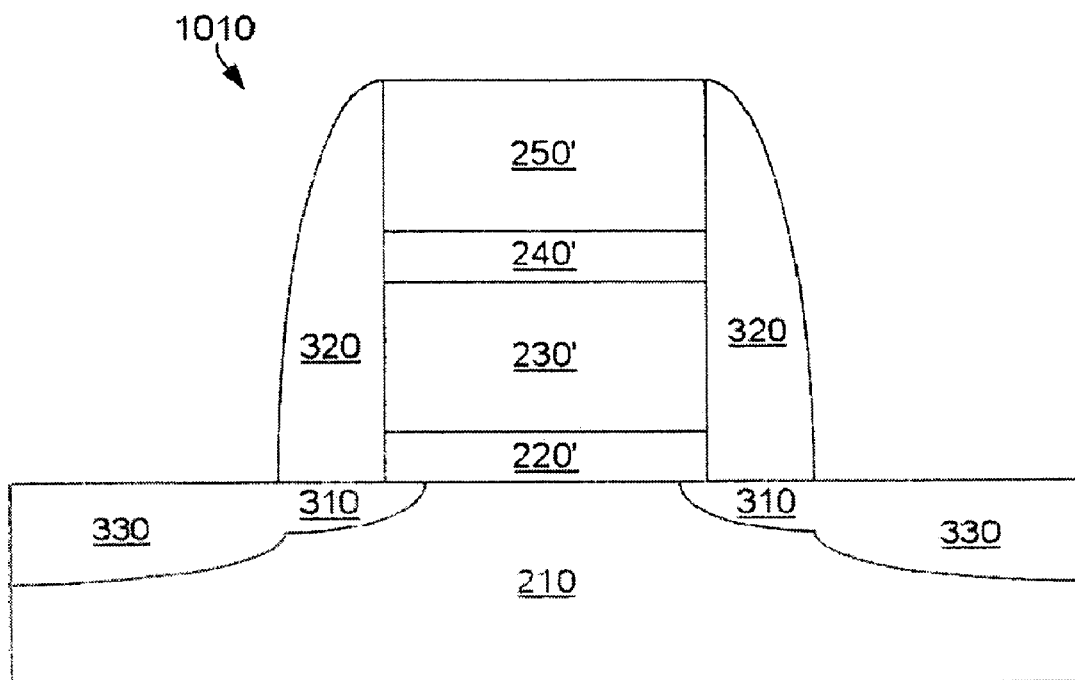
FIG. 5 show embodiments for making a semiconductor device in accordance with present invention.

Referring to FIG. 5, after the formation of the sidewall spacers 320, another ion implantation step may be performed to form the source/drain regions 330. In one or more embodiments, the source/drain regions 330 may be formed as heavily doped drain (HDD) regions. The dopant type of the source/drain regions 330 may be the same as the dopant type of the extension regions 310. The dopant concentration of the source/drain regions 330 may be greater than the dopant concentration of the extension regions 330. The depth of the source/drain regions 330 may be greater than the depth of the extension regions 310.

In one or more embodiments, the ion implantation step used to form the source/drain extensions 310 may also serve to dope the control gate layer 250' with either n-type or p-type dopants. Likewise, in one or more embodiments, the ion implantation step used to form the source/drain regions 330 may be used to dope the control gate layer 250' with n-type or p-type dopants.

In one or more embodiments, the device 1010 shown in FIG. 5 may be useful as a memory device such as a charge storage memory device. In one or more embodiments, the charge storage memory device may be a floating gate memory device. In this case, the charge storage layer 230' may be a floating gate layer. The floating gate layer may also be referred to as a floating gate for the floating gate memory device. The floating gate layer may, for example, be formed of a carbon allotrope (such as, for example, graphite). The control gate layer 250' (which may also be referred to as control gate 250') may, for example, also be formed of a carbon allotrope. In another embodiment, the control gate 250' may, for example, be formed of a doped polysilicon or some other conductive material. The first dielectric layer 220' may, for example, be formed of an oxide, such as silicon dioxide (which may be formed by a growth process). The second dielectric layer 240' may, for example, be formed of an oxide material or of a high-k material. In another embodiment, the second dielectric layer 240' may be formed of an oxide-nitride-oxide stack. Of course, the materials mentioned are only examples and other materials may be substituted for the materials described.

In one or more embodiments, the charge storage device 1010 may be a floating gate device. In one or more embodiments, a floating gate device may possibly be programmed by Fowler-Nordheim tunneling or by hot-carrier injection. In one or more embodiments, erasure may possibly be accomplished by UV emission or by Fowler-Nordheim tunneling. In one or more embodiments, it is possible that electrical charge may be stored on the floating gate so as to adjust the threshold voltage $V_T$ of the device. Of course, these are only examples of possible ways to operate a floating gate device and other ways may also be possible.

In one or more embodiments, the charge storage memory device 1010 may be charge trapping memory device. In this case, the charge storage layer 230' may be a charge trapping layer. The charge trapping layer may, for example, comprise a nitride (such as silicon nitride), an oxynitride, a nanocrystalline material or a high-k material. In one or more embodiments, the charge storage layer may comprise a dielectric material. The first dielectric layer 220' may, for example, be an oxide (such as a silicon dioxide). The oxide may, for example, be formed by a growth process. The second dielectric layer 240' may, for example, be an oxide or, possibly, a high-k material. The control gate layer 250' may, for example, be a carbon allotrope such as graphite (or possibly another conductive carbon allotrope). Of course, the materials described are only example and other materials may be substituted for the materials described.

In one or more embodiments, the device 1010 may be a charge trapping device. In one or more embodiments, a charge trapping device may possibly be programmed by applying a sufficiently high positive voltage to the control gate 250'. This may lead to an electron tunneling current (for example, by Fowler-Nordheim tunneling) from the substrate 210 through the first dielectric layer 220' and toward the charge trapping layer 230', where the electrons may be trapped. The trapped electrons may give rise to an increased threshold voltage $V_T$ which may indicate that the device is programmed. In one or more embodiments, a charge trapping device may possibly be erased by applying a suitable negative voltage to the control gate. In one or more embodiments, as another example, a charge trapping device may possibly be programmed by hot-carrier injection. Of course, these are only examples of possible ways to possibly operate a charge trapping device and other ways may also be possible.

In one or more embodiments, it is noted that the structure shown in FIG. 2C may, of course, also be used to form a charge storage memory device such as a floating gate device or a charge trapping device.

Figure 6:
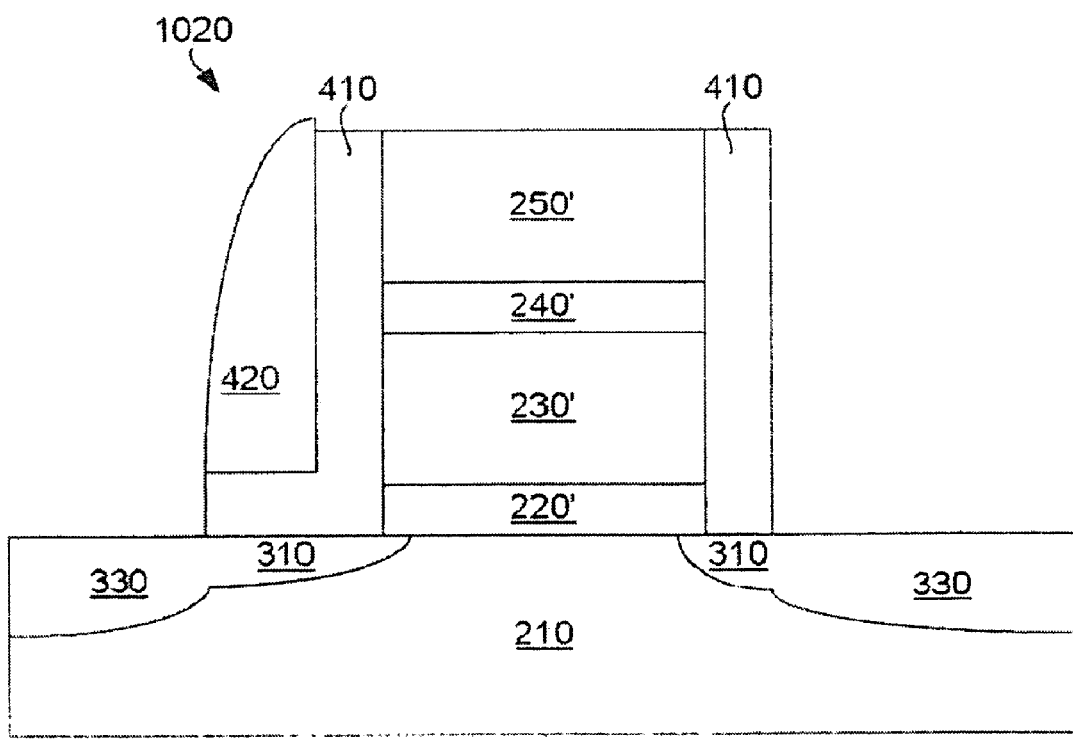
FIG. 6 shows an embodiment of a semiconductor device of the present invention.

Another embodiment is shown in FIG. 6. FIG. 6 shows a charge storage memory device 1020. In the embodiment shown in FIG. 6, a layer 410 is formed over the sidewalls of the gate stack 300 and on the substrate 210 before the formation of sidewall spacers. In one or more embodiments, layer 410 may be a dielectric layer. In one or more embodiments, the layer 410 may comprise an oxide, a nitride, an oxynitride or combinations thereof. A sidewall spacer 420 is then formed over the sidewall surface of the layer 410. The sidewall spacer may, for example, be formed of a polysilicon material. In one or more embodiments, the polysilicon material, may be n-doped or p-doped. The sidewall spacer 420 may serve as a select gate for the memory device 1020. The gate stack 300 comprises a first gate dielectric layer 220', a charge storage layer 230', a second dielectric layer 240' and a gate control layer (or control gate) 250'. The possible materials for the different layers have been described above. Also, as described above, the charge storage layer 230' may be a floating gate layer (also referred to as a floating gate) or it may be a charge trapping layer. The select gate 420 and the control gate 250 may be independently controllable.

Referring to FIG. 6, in one or more embodiments, the spacer select gate 420 may comprise a carbon allotrope. As an example, the spacer select gate 420 may comprise graphite. The embodiment shown in FIG. 6 shows the source/drain extensions 310 as well as the source/drain regions 330.

In one or more embodiments, the charge storage memory device 1010 shown in FIG. 5 or the charge storage memory device 1020 shown in FIG. 6 may be stand-alone memory devices. In one or more embodiments, the charge storage memory device 1010 shown in FIG. 5 or the charge storage memory device 1020 shown in FIG. 6, may be used as an embedded memory device in combination with at least one logic device on the same chip or the same substrate. Hence, the same chip (or same substrate) may include a memory portion (with one or more memory devices) and a logic portion (with one or more logic devices).

Although the invention has been described in terms of certain embodiments, it will be obvious to those skilled in the art that many alterations and modifications may be made without departing from the invention. Accordingly, it is intended that al such alterations and modifications be included within the spirit and scope of the invention.

What is claimed is:

1. A floating gate memory device, comprising:
   a substrate;
   a first dielectric layer disposed over said substrate;
   a floating gate disposed over said first dielectric layer, said floating gate comprising graphite;
   a passivation layer disposed over said floating gate;
   a second dielectric layer disposed over said passivation layer;
   and
   a control gate disposed over said second dielectric layer.

2. The memory device of claim 1, wherein said control gate layer comprises a carbon allotrope.

3. The memory device of claim 1, wherein said control gate comprises a conductive material.

4. A floating gate memory device, comprising:
   a substrate; and
   a gate stack disposed over said substrate, said gate stack comprising
      a first dielectric layer;
      a floating gate disposed over said first dielectric layer, said floating gate comprising graphite;
      a passivation layer disposed over said floating gate;
      a second dielectric layer disposed over said passivation layer; and
      a control gate disposed over said second dielectric layer.

5. The device of claim 4, wherein said control gate comprises a carbon allotrope.

6. The device of claim 4, further comprising a spacer select gate disposed over said substrate and laterally disposed from a sidewall of said gate stack.

7. The device of claim 1, wherein said control gate comprises a polysilicon material.

8. The device of claim 4, wherein said control gate comprises a polysilicon material.

9. The device of claim 1, wherein said passivation layer includes a SiC layer.

10. The device of claim 4, wherein said passivation layer includes a SiC layer.

* * * * *